United States Patent
Kubota et al.

(10) Patent No.: US 7,212,059 B2
(45) Date of Patent: May 1, 2007

(54) LEVEL SHIFT CIRCUIT

(75) Inventors: Yasushi Kubota, Ibaraki (JP);
Masahiro Sato, Tokyo (JP); Hiroshi Watanabe, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 58 days.

(21) Appl. No.: 11/103,893

(22) Filed: Apr. 12, 2005

(65) Prior Publication Data

US 2005/0248381 A1    Nov. 10, 2005

(30) Foreign Application Priority Data

May 10, 2004    (JP) .............................. 2004-140155

(51) Int. Cl.
*H03L 5/00* (2006.01)

(52) U.S. Cl. ........................................ 327/333; 326/81

(58) Field of Classification Search ................ 327/143, 327/333, 427; 326/68, 80, 81
See application file for complete search history.

(56) References Cited

U.S. PATENT DOCUMENTS

| | | | | |
|---|---|---|---|---|
| 6,806,757 B2 * | 10/2004 | Mukai | ........................ | 327/333 |
| 6,809,554 B2 * | 10/2004 | Wada | .......................... | 326/81 |
| 2004/0041615 A1 * | 3/2004 | Mukai | ........................ | 327/333 |
| 2004/0056682 A1 * | 3/2004 | Wada | .......................... | 326/68 |

* cited by examiner

*Primary Examiner*—Long Nguyen
(74) *Attorney, Agent, or Firm*—W. James Brady, III; Frederick J. Telecky, Jr.

(57) ABSTRACT

The circuit is to provide a type of level shift circuit that operates correctly even when the input timings of voltages from multiple power sources are different. Level shift circuit 10 that outputs the output signal of the high voltage source as a response to the input signal of the low voltage source has the following attribute: When feeding of the low voltage source is delayed with respect to feeding of the high voltage source, on the basis of the high voltage source, power-on-reset circuit 20 generates power-on-reset signal PWR. During the period before the input signal of the low voltage source is fed as a response to power-on-reset PWR, latch circuit 30 initializes the level shift circuit, and holds its output OUT at the low level.

6 Claims, 5 Drawing Sheets

LEVEL SHIFT CIRCUIT

CROSS REFERENCE TO RELATED APPLICATIONS

This application claims priority under 35 USC § 119 of Japanese Application Serial No. 2004-140155, filed May 10, 2004.

FIELD OF THE INVENTION

The present invention pertains to a type of level shift circuit for conversion of voltage levels. Especially, the present invention pertains to a type of level shift circuit that can maintain stable operation when voltages are fed at different timings from multiple voltage sources.

BACKGROUND OF THE INVENTION

Figure 10:
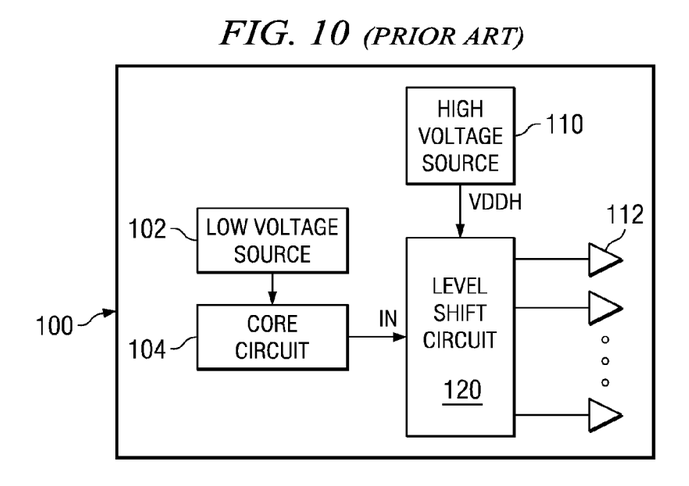
FIG. 10 is a diagram illustrating an example of the circuit carried on the semiconductor chip in the prior art.

For system LSI, etc., circuits for executing multiple functions are integrated on a semiconductor chip. Usually, different circuits operate on different voltage levels corresponding to the purposes and characteristics. For example, as shown in FIG. 10, semiconductor chip 100 for use in mobile phones, PDAs, etc. contains core circuit 104 that operates at a low voltage of about 1.8 V fed from low voltage source 102, and driver 112 that operates at a high voltage of about 20 V fed from high voltage source 110. Driver 112 needs a high voltage in order to drive a liquid crystal or other display. In order to ensure output of the high-voltage driving signal as a response to low voltage level input signal IN from core circuit 104, level shift circuit 120 is set between said two circuits.

Figure 11:
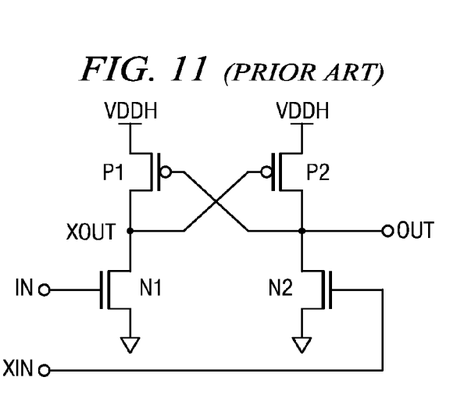
FIG. 11 is a diagram illustrating a conventional level shift circuit in the prior art.

FIG. 11 is a diagram illustrating the constitution of a conventional level shift circuit of the prior art. For example, this type of level shift circuit is disclosed in FIG. 32 of Patent Reference 1. The level shift circuit has a pair of inverter connected P type MOS transistors P1, P2 and N type MOS transistors N1, N2 between VDDH and ground potential (GND). The gates of transistors P1, P2 are mutually cross coupled to output nodes XOUT, OUT of the other side, and input signals IN, XIN that are complementary to each other are fed to the gates of transistors N1, N2. Input signals IN, XIN are signals on the low voltage level (VDD–GND).

Figure 12:
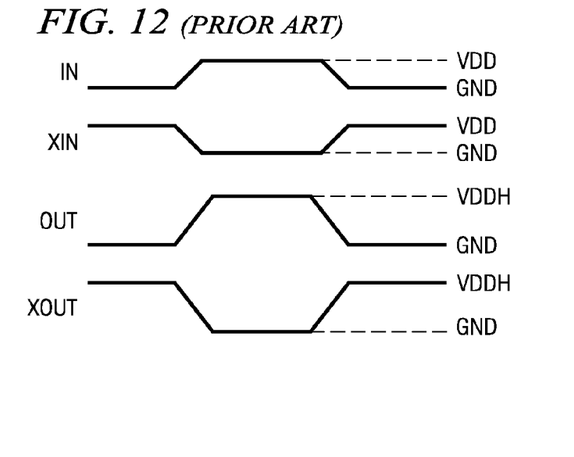
FIG. 12 is a timing chart illustrating the operation of the level shift circuit in FIG. 10.

FIG. 12 is a timing chart illustrating the operation of the level shift circuit shown in FIG. 11. When high level (VDD) and low level (GNG) signals are input as input signals IN, XIN, from output terminal OUT, a high level signal (VDDH) obtained by level shift of the voltage is output. When the input signal is inverted, as a response, the output signal from output terminal OUT is inverted.

Patent Reference 1: Japanese Kokai Patent Application No. 2001-298356

Figure 13:
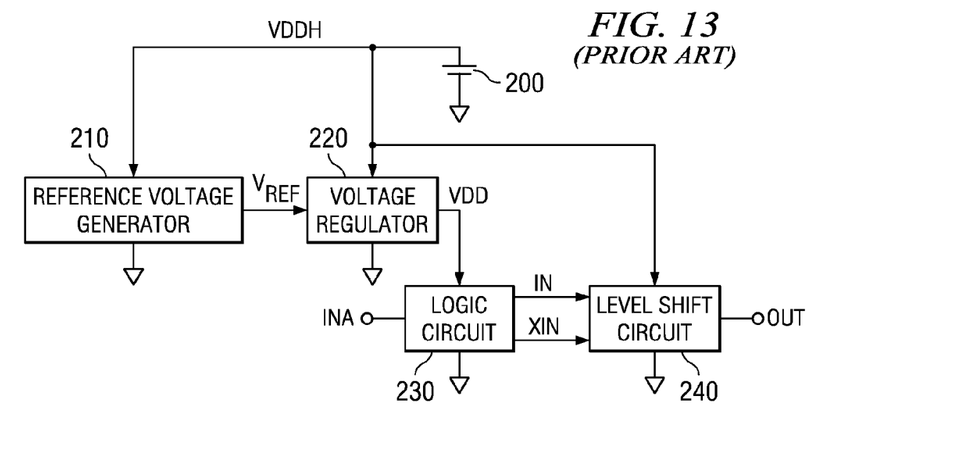
FIG. 13 is a diagram illustrating an example of the circuit in which the level shift circuit operates as high voltage and low voltage are generated.

However, the conventional level shift circuit has the following problems. FIG. 13 is a diagram illustrating an example of the level shift circuit carried on a conventional semiconductor chip. On this chip, there are the following parts: battery 200 that feeds the high voltage (VDDH), reference voltage generator 210 that is fed high voltage from battery 200, voltage regulator 220, logic circuit 230 and level shift circuit 240. Reference voltage generator 210 generates reference voltage (Vref) from the high voltage, and feeds it to voltage regulator 220. On the basis of the reference voltage (Vref), voltage regulator 220 generates a low voltage (VDD) of 1.8 V, and outputs it to logic circuit 230. As a response to the input to input terminal INA, logic circuit 230 feeds complementary low voltage input signals IN, XIN to level shift circuit 240. As a response to complementary input signals IN, XIN, level shift circuit 240 outputs the high voltage signal from output terminal OUT.

Figure 14:
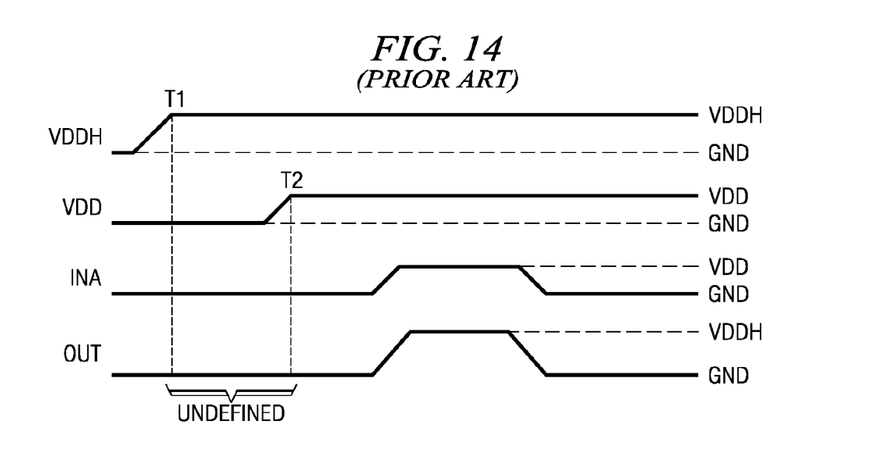
FIG. 14 is a timing chart illustrating the operation of the circuit shown in FIG. 12.

FIG. 14 is a timing chart illustrating the operation. A high voltage is fed from battery 200. Then, after a prescribed period, a low voltage is fed from voltage regulator 220. That is, there is a delay or time difference between time T1 when the high voltage is fed and time T2 when the low voltage is fed. VDD is not fed to logic circuit 230 during time T1–T2, so that complementary input signals IN, XIN become unstable. The high voltage (VDDH) is first fed to level shift circuit 240. As complementary input signals IN, XIN become unstable, the output from the output terminal during this period becomes unstable, and this leads to problems in the circuit operation. For example, when the level shift circuit is used for the chip select signal, reset signal, etc., if there the output is unstable state, erroneous operation may occur, which is a serious problem.

SUMMARY OF THE INVENTION

The purpose of the present invention is to solve the aforementioned problems of the prior art by providing a type of level shift circuit characterized by the fact that even when the timings of voltage fed from different voltage sources are different, correct operation still can be performed.

In addition, another purpose of the present invention is to provide a type of level shift circuit with a less complex constitution and a lower cost than that of the prior art.

The level shift circuit of the present invention outputs the output signal of the second voltage source as a response to the input signal of the first voltage source, and it has the following constitution. There is a latch circuit that operates as follows: when the input signal of the first voltage source is input with a delay from feeding of the second voltage source, as a response to the control signal generated on the basis of the second voltage source, the output of the level shift circuit is held at the voltage of either the first logic level or the second logic level in the second voltage source.

In a preferable scheme, the latch circuit contains a NAND gate and an inverter fed by the second voltage source; the output node of the NAND gate is connected to the input of the inverter; the output of the inverter is connected to one of the inputs of the NAND gate; a control signal is connected to the other input of the NAND gate; and the output of the inverter is connected to the output of the level shift circuit.

When the second voltage is fed from the second voltage source, the control signal contains a pulse corresponding to said delay, and the output of the NAND gate responds to said pulse, and is held at the voltage of either the first logic level or the second logic level in the second voltage source. For example, the control signal is a power-on-reset signal that is started when the power is turned ON, and this signal initializes the circuit.

Also, the level shift circuit contains a first transistor and a second transistor; the input signal of the first voltage source is fed to the gate of the first transistor; one end is connected to the output of the NAND gate; the other end is connected to the reference potential; the input signal that is complementary to the input signal of the first transistor is fed to the gate of said second transistor; one end is connected to the output of the inverter; and the other end is connected to the reference potential.

For the level shift circuit of the present invention, the level shift circuit has a first MOS transistor and a second MOS transistor, with complementary signals of the first voltage source fed to their gates, and a latch circuit that operates as follows: the second voltage source is fed to it; the voltages at different logic levels in said second voltage source can be held at its first node and second node; and it outputs the voltage at the logic level of the second voltage source held at said first node or second node corresponding to said input signal; in this level shift circuit, one end of said first MOS transistor is connected to the first node of said latch circuit, and the other end is connected to a reference potential; one end of the second MOS transistor is connected to said second node of said latch circuit, and the other end is connected to said reference potential; when input of the input signal of said first voltage source is delayed with respect to feeding of said second voltage source, during the period corresponding to said delay time, the first node or second node of the latch circuit is fixed at the voltage of either the first logic level or the second logic level.

Also, the level shift circuit of the present invention has the function of monitoring multiple input signals fed from multiple voltage sources including a first voltage source; the level shift circuit has a detector to receive said multiple input signals and which detects whether each input signal is at the voltage level of the corresponding voltage source, a latch circuit, which is fed by the second voltage source, and which can hold the voltages at different logic levels in said second voltage source at its first node and second node, and outputs the voltage at the logic level of the second voltage source held at said second node corresponding to the detection result of the detector connected to said first node, and a transistor circuit that operates as follows: when input of the input signal of first voltage source is delayed with respect to feeding of the second voltage source, in the period corresponding to the delay time, the first node or second node of the latch circuit is held at the voltage of either the first logic level or the second logic level.

The following scheme is preferred: when said detector detects the voltage level of the voltage source corresponding to each input signal, the first node goes to the voltage of the other logic level said first logic level and second logic level. For example, the detector contains multiple MOS transistors connected in series; the various input signals are connected to the gates of the various transistors; and, when multiple transistors are ON, the first node goes to said other voltage.

The level shift circuit of the present invention converts the input signal of a low voltage source to the output signal of a high voltage source. However, it may also operate oppositely, that is, it can convert the input signal of a high voltage source to the output signal of a low voltage source. Also, as long as there is no special reason, there is no special limitation on the type of voltage source. The voltage sources include voltage generators, booster circuits or voltage-lowering circuits, etc. formed on-chip, as well as external power source voltages fed from outside the chip.

REFERENCE NUMERALS AND SYMBOLS AS SHOWN IN THE DRAWINGS

In the FIGS. 10, 12, 14 represent a level shift circuit, 20, 340 represent a power-on-reset circuit, 30, 32 represent a latch circuit, 40 represents an input detector, 310 represents a high voltage source, 320 represents a First voltage generating part, 330 represents a second voltage generating part.

DETAILED DESCRIPTION OF THE DRAWINGS

For the level shift circuit of the present invention, even when the second voltage source is fed first, followed them by the input signal of the first voltage source, it is still possible to hold the output of the level shift circuit to the voltage of either the first logic level or the second logic level of the second voltage source as a response to the input timing. Consequently, it is possible to prevent unstable operation of the level shift circuit. As a result, it is also possible to handle applications using multiple power sources having different feed timings of the voltage sources. In addition, by having a portion of the level shift circuit in the latch type, it is possible to have a relatively simple constitution of the level shift circuit, and it is possible to lower the cost.

In the following, the preferable embodiments of the level shift circuit of the present invention will be explained in more detail with reference to figures.

Figure 1:
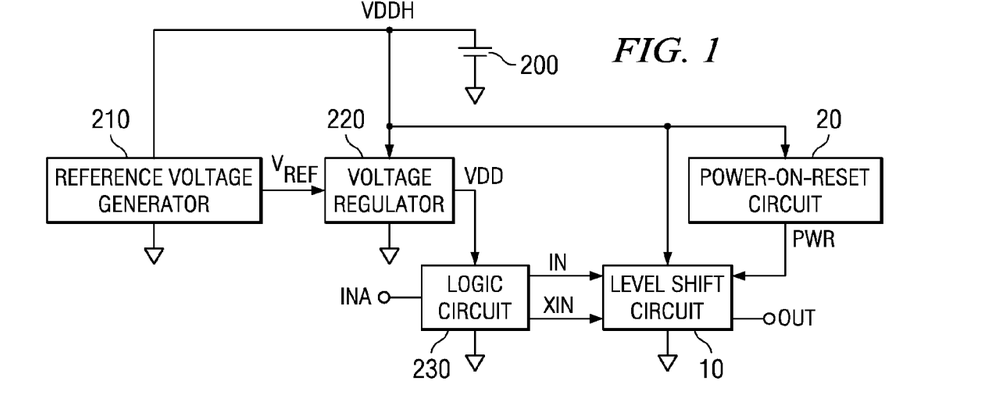
FIG. 1 is a diagram illustrating an example of the circuit carried on the semiconductor chip in Embodiment 1.

FIG. 1 is a diagram illustrating an example of the circuit carried on a semiconductor chip of this embodiment. The same part numbers as those in FIG. 13 are adopted. The following circuits are added to the circuit shown in FIG. 1: level shift circuit 10 having a novel constitution, and power-on-reset circuit 20, which receives a high voltage (VDDH) from battery 200 and which feeds power-on-reset signal PWR (control signal) containing a prescribed pulse to level shift circuit 10.

Figure 2:
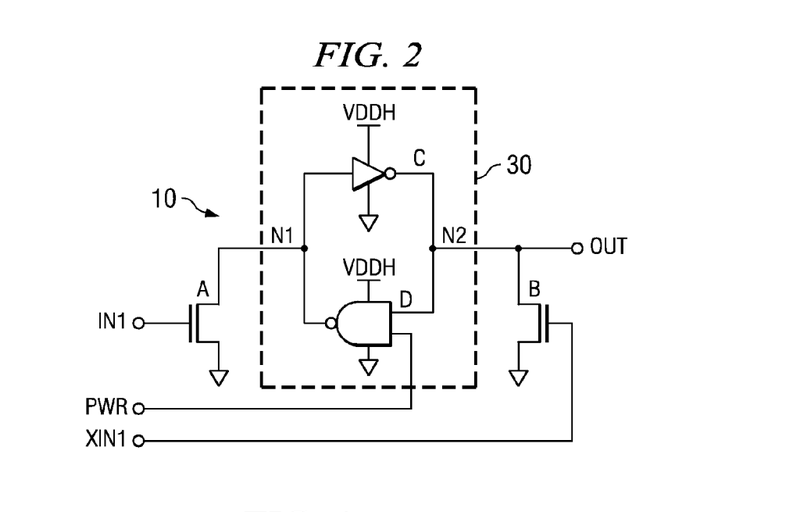
FIG. 2 is a diagram illustrating the constitution of the level shift circuit in Embodiment 1.

FIG. 2 is a diagram illustrating the constitution of level shift circuit 10. Level shift circuit 10 is composed of two N-type MOS transistors A, B and latch circuit 30 connected to them. Input terminal IN1 is connected to the gate of transistor A; its drain is connected to first node N1 of latch circuit 30; and its source is connected to ground GND. Input terminal XIN1 is connected to the gate of transistor B; its drain is connected to second node N2 of the latch circuit; and its source is connected to GND. As shown in FIG. 1, input signals at the low voltage level (VDD–GND) and complementary to each other are input from logic circuit 230 to input terminals IN1 and XIN1.

Latch circuit 30 has inverter C and NAND gate D as high voltage rating elements fed high voltage (VDDH). The output of NAND gate D is node N1, and it is connected to the input of inverter C. The output of inverter C is node N2, and it is connected to one of the inputs of NAND gate D as well as output terminal OUT. Power-on-reset signal PWR from power-on-reset circuit 20 is connected to the other input of NAND gate D. Nodes N1 and N2 hold the inverted voltages of high level (VDDH) and low level (GND), respectively, at the high voltage level (VDDH–GND). As a response to the input signals to input terminals IN1, XIN1, output terminal OUT outputs the high voltage output signal (VDDH–GND) that has been level shifted.

Figure 3:
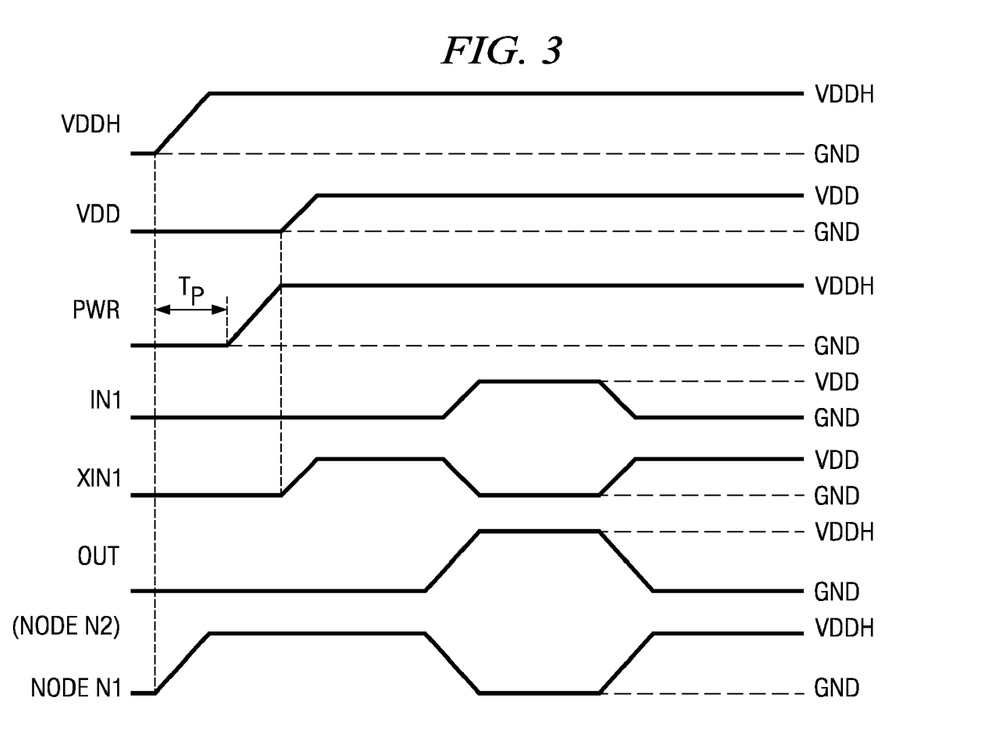
FIG. 3 is a timing chart illustrating the operation of the level shift circuit in Embodiment 1.
Figure 4:
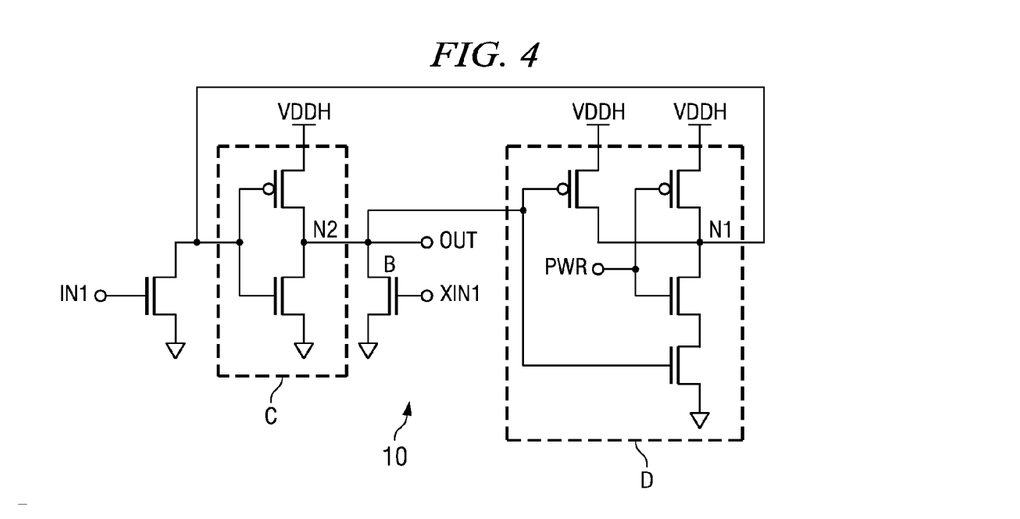
FIG. 4 is a diagram illustrating an example of the constitution of transistors in the level shift circuit.

In the following, the operation of the level shift circuit will be explained with reference to the timing chart shown in FIG. 3. When the semiconductor chip is operated, the high voltage (VDDH) from battery 200 rises, and this voltage is fed to various circuits. On the basis of the high voltage, power-on-reset circuit 20 generates power-on-reset signal PWR containing the low-level pulse, and it outputs the power-on-reset signal to level shift circuit 10. Low level pulse period Tp should be sufficiently long to perform initialization of latch circuit 30. For example, it corresponds to the time difference from feeding of the high voltage to generation of the low voltage VDD, that is, it may be equal to said time difference.

During the period before VDD is fed, input terminals IN1, XIN1 of transistors A, B of level shift circuit 10 are undefined. However, as power-on-reset signal PWR is fed to the input of NAND gate D of latch circuit 30, level shift circuit 10 is initialized. That is, during low level pulse period Tp of power-on-reset signal PWR, node N1 as output of NAND gate D is held at the high level, and node N2 and output terminal OUT are held at the low level. As a result, the influence due to undefined operation of transistors A, B is eliminated.

Then, for example, nearly synchronized to the rise timing of the low voltage (VDD), power-on-reset signal PWR rises to the high level. As a result, NAND gate D can perform the same operation as the inverter that inverts the other input signal.

When low voltage (VDD) rises complementary input signals are input from logic circuit 230 to input terminals IN1, XIN1. When input terminal IN1 is at the low level, and XIN1 is at the high level, transistor A is OFF, transistor B is ON, and a low-level output signal is output from output terminal OUT. Then, as the input signals to input terminals IN1, XIN1 are inverted, transistor A is ON, transistor B is OFF, node N1 goes to the low level, and a high-level output signal of VDDH is output from output terminal OUT.

In said Embodiment 1, a portion of the level shift circuit is formed in the latch type as inverter C and NAND gate D, and initialization of the circuit is performed only with the high voltage signal. As a result, as shown in FIG. 8, it is possible to form level shift circuit 10 with 8 transistors. Consequently, it is possible to provide a level shift circuit with a low cost and a simple structure. In addition, it is possible to handle applications using multiple power sources so that high-voltage power source (VDDH) is input first, and low-voltage power source (VDD) is input later.

Figure 5:
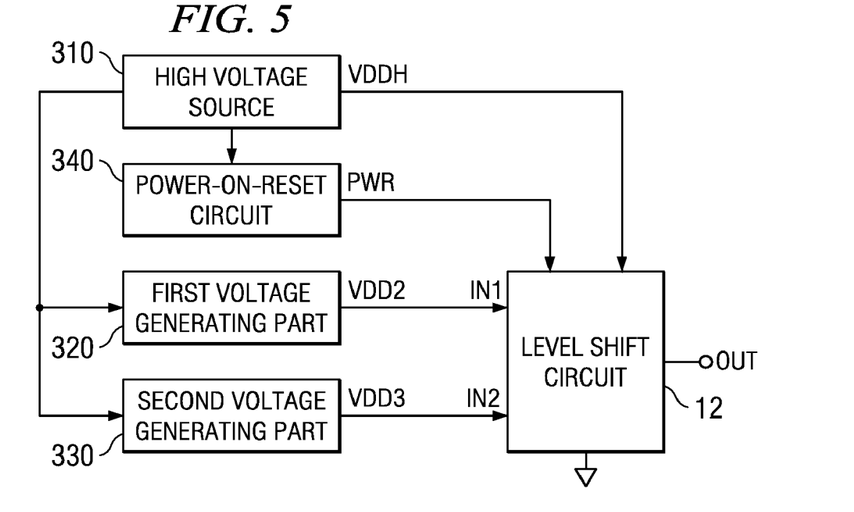
FIG. 5 is a diagram illustrating an example of the circuit carried on the semiconductor chip in Embodiment 2.

In the following, Embodiment 2 of the present invention will be explained. FIG. 5 is a diagram illustrating an example of the circuit carried on a semiconductor chip in Embodiment 2. As shown in this figure, high-voltage power source 310 formed on-chip is fed to first and second voltage generating parts 320, 330 as well as level shift circuit 12. For power-on-reset circuit 340, as high voltage VDDH is fed when power is turned ON, power-on-reset signal PWR of the voltage level of VDD1 (VDD1–GND) is fed to level shift circuit 12.

On the basis of high voltage (VDDH), first voltage generating part 320 generates low voltage (VDD2), and feeds it to input terminal IN1 of level shift circuit 12. On the basis of high voltage (VDDH), second voltage generating part 330 generates low voltage (VDD3), and feeds it to input terminal IN2 of level shift circuit 12.

Figure 6:
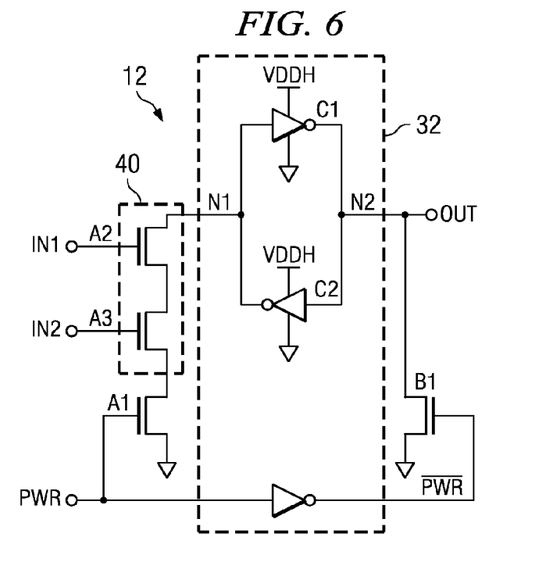
FIG. 6 is a diagram illustrating the constitution of the level shift circuit in Embodiment 2.

Level shift circuit 12 has a multiple power source monitoring function for monitoring the input signals from first and second voltage generating parts 320, 330. Its constitution is shown in FIG. 6. As shown in FIG. 6, level shift circuit 12 is composed of two N type MOS transistors A1, B1 that receive the complementary inputs of power-on-reset signal PWR, input detector 40 that detects the voltage level of the input signals sent to input terminals IN1, IN2, and latch circuit 32.

Power-on-reset signal PWR is connected to the gate of transistor A1. Its drain is connected to input detector 40, and its source is connected to GND. The signal obtained by inverting power-on-reset signal PWR is input to the gate of transistor B1. Its drain is connected to node N2 of latch circuit 32 and output terminal OUT, and its source is connected to GND.

Input detector 40 contains two N type MOS transistors A2, A3. The signal on VDD2 level is fed from input terminal IN1, that is, first voltage generating part 320, to the gate of transistor A2. Its drain is connected to node N1 of latch circuit 32, and its source is connected to the drain of transistor A3. The signal on VDD3 level is fed from input terminal IN2, that is, second voltage generating part 330, to the gate of transistor A3, and its source is connected to the drain of transistor A1.

Latch circuit 32 contains two inverters C1, C2 with high voltage VDDH fed to them. The output of inverter C1 is connected to node N2 and output terminal OUT of level shift circuit 12, and it is connected to the input of inverter C2. The output of inverter C2 is connected to node N1 and the input of inverter C1.

Figure 7:
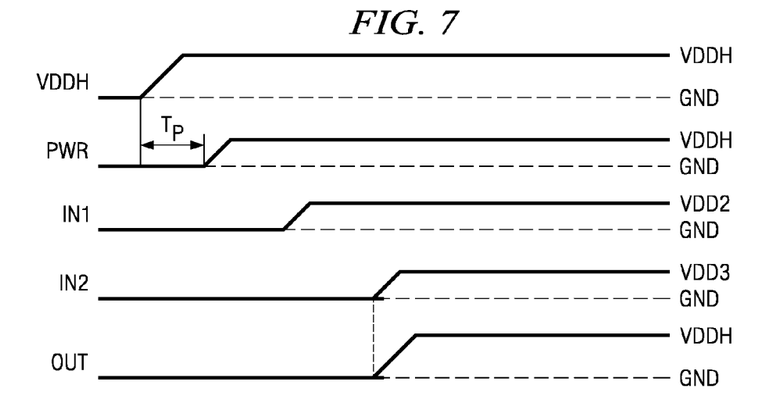
FIG. 7 is a timing chart illustrating the operation of the level shift circuit in Embodiment 2.

FIG. 7 is a timing chart illustrating the operation of level shift circuit 12. When the semiconductor chip is started, VDDH is fed from high voltage source 310 to the various parts. On the basis of VDDH, power-on-reset circuit 340 generates power-on-reset signal PWR containing the low level of pulse width Tp, which is output to level shift circuit 12. As a response to this pulse signal, transistor A1 is OFF, transistor A2 is ON, and node N2 and output terminal OUT are held at the low (GND) level. As a result, latch circuit 32 is initialized, and the undefined state of output terminal OUT of level shift circuit 12 can be avoided.

During the period when power-on-reset signal PWR is at the low level, the input signals of VDD2 and VDD3 are not fed to input terminals IN1, IN2 from first and second voltage generating parts 320, 330, and transistors A2 and A3 remain OFF. Low-level period Tp is preferably set to be equal to or shorter than the period until generation of VDD2, VDD3 from first and second voltage generating parts 320, 330.

As power-on-reset signal PWR rises to VDDH, transistor A1 is turned ON, and input detector 40 can detect the voltage level of the input signals applied on input terminals IN1, IN2. Also, as transistor B1 is turned OFF, node N2 and output terminal OUT are cut off from GND level. Then, as shown in FIG. 7, voltage VDD2 is applied on input terminal IN1, and voltage VDD3 is applied on input terminal IN2. As a result, transistors A2, A3 are turned ON, node N1 goes to the low level, and level-shifted high voltage VDDH signal is output from output terminal OUT.

With Embodiment 2 with the aforementioned constitution, it is possible to provide a type of level shift circuit equipped with a multiple power source monitoring function for monitoring the input signals from multiple power sources. In the aforementioned example, the constitution has a simple structure in which input terminals IN1, IN2 are directly connected to the power source voltages. However, when there is a certain demand for precision of the voltage under monitoring, one may adopt a scheme in which the signal from UVLO (Under Voltage Lockout Circuit) is input and monitored.

Figure 8A:
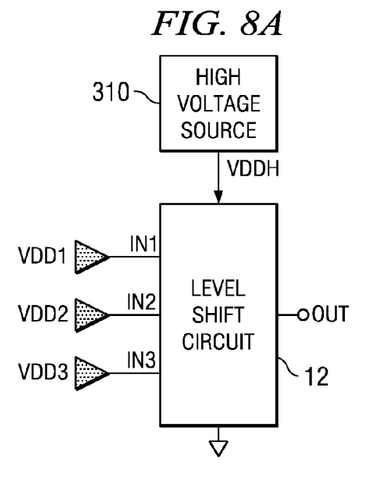
FIG. 8 is a diagram illustrating another example of the circuit carried on the semiconductor chip in Embodiment 2.

FIG. 8 is a diagram illustrating another example of the circuit carried on the semiconductor chip. In the aforementioned example, high voltage source 310 and first and second voltage generating parts 320, 330 are set in the semiconductor chip. However, as shown in FIG. 8(a), one may also feed low voltages VDD1, VDD2, VDD3 from external terminals of the chip. In this case, the power-on-reset circuit is not a necessity, and input signals of VDD1, VDD2, VDD3 are connected from the external terminals to the gates of transistors A1, A2, A3 of input detector 40 of level shift circuit 12, respectively. As a result, when there are inputs of all of voltages VDD1-VDD3 from the external terminals, level shift circuit 12 outputs the output signal of level-shifted high voltage VDDH.

Figure 8B:
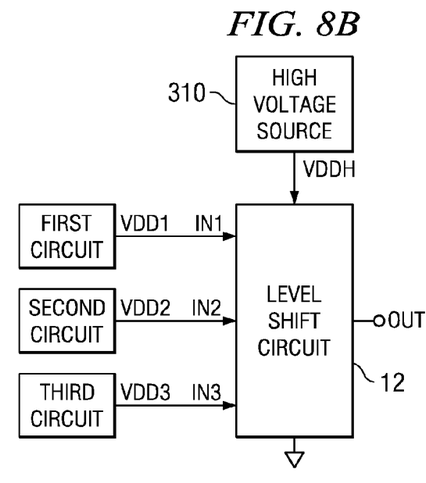

In addition, as shown in FIG. 8(b), the multiple voltage sources may be signals from the circuit within the chip. That is, in this case, signals of VDD1, VDD2, VDD3 are fed from the first, second and third circuits, respectively. Monitoring is performed on the voltage levels of said signals, and a level-shifted output signal is output.

Figure 9:
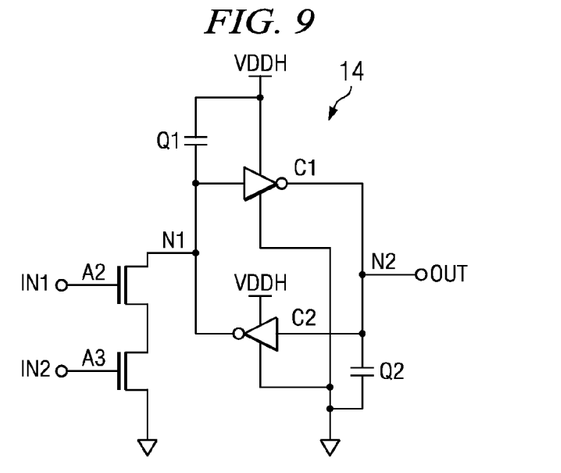
FIG. 9 is a diagram illustrating the constitution of the level shift circuit in Embodiment 3.

FIG. 9 is a diagram illustrating the level shift circuit in Embodiment 3 of the present invention. In Embodiment 3, instead of power-on-reset signal PWR, capacitors Q1, Q2 are used to perform the power source monitoring function. Capacitor Q1 is connected between node N1 and VDDH, and capacitor Q2 is connected between node N2 and GND.

As VDDH is fed before input signals IN1, IN2, the charge from VDDH is charged to capacitor Q1, node N1 goes to the high level, and node N2, that is, output terminal OUT, is held at the low level. As a result, it is possible to suppress the phenomenon of undefined potential of node N2 due to capacitor Q2 during the period until charging. Then, as input signals IN1, IN2 rise to VDD2, VDD3, the charge of capacitor Q1 is discharged, node N1 goes to the low level, capacitor Q2 is charged, and the output signal of VDDH is output from node N2, namely, output terminal OUT.

In this way, in said Embodiment 3, by setting a pair of capacitors Q1, Q2, it is possible to easily form a level shift circuit having power source monitoring function.

In the level shift circuit explained in the aforementioned embodiments, the output signal at the high voltage level is output as a response to the input signal at the low voltage level. However, this is merely an example, and the present invention is not limited to this scheme. One may also adopt the opposite scheme in which the level shift circuit outputs the output signal at the low voltage level as a response to the input signal at the high voltage level.

The preferable embodiments of the present invention have been explained in detail above. However, the present invention is not limited to the aforementioned embodiments. Various modifications or changes can be made as long as the gist of the present invention described in the claims is observed.

The level shift circuit of the present invention can be used in semiconductor devices that carry circuits using multiple power sources, including external power sources and internal power sources. Especially, the present invention facilitates applications in the case of multiple circuits with different operation voltages, such as a core circuit that operates at a low voltage and a driver for driving display at a high voltage, in a single chip.

The invention claimed is:

1. A level shift circuit, comprising:
    the level shift circuit responds to an input signal of a first voltage source and outputs an output signal of a second voltage source;
    and the level shift circuit has a latch circuit that operates as follows: when the input signal of said first voltage source, which is delayed with respect to feeding of the second voltage source, is input, said latch responds to a power-on-reset signal generated on the basis of the second voltage source, and holds the output of the level shift circuit at the voltage of either a first logic level or a second logic level of the second voltage source.

2. The level shift circuit described in claim 1 wherein said latch circuit contains a NAND gate and an inverter with the second voltage source fed to them; the output node of the NAND gate is connected to the input of the inverter; the output of the inverter is connected to one of two inputs of the NAND gate; the power-on-reset signal is connected to the other input of the NAND gate; and the output of the inverter is connected to the output of the level shift circuit.

3. The level shift circuit described in claim 2 wherein said power-on-reset signal contains a pulse corresponding to said delay when said second voltage is fed from said second voltage source, and the output of the NAND gate is held at the voltage of either the first logic level or the second logic level of said second voltage source.

4. The level shift circuit described in claim 3 wherein the level shift circuit also contains a first transistor and a second transistor; the input signal of the first voltage source is fed to the gate of the first transistor; the drain of the first transistor is connected to the output of the NAND gate; the source of the first transistor is connected to a reference potential; a complementary input signal that is complementary to the input signal of the first transistor is fed to the gate of said second transistor; the drain of the second transistor is connected to the output of the inverter; and the source of the second transistor is connected to the reference potential.

5. A level shift circuit, comprising:
    a first MOS transistor and a second MOS transistor, with complementary signals of a first voltage source fed to their gates,
    and a latch circuit that operates as follows: a second voltage source is fed to the latch; the voltages on different logic levels of said second voltage source are capable of being held at the latch's first node and second node; and the latch outputs the voltage on a logic level of the second voltage source held at said first node or second node corresponding to said input signal;
    the drain of said first MOS transistor is connected to the first node of said latch circuit, and the source of said first MOS transistor is connected to a reference potential;
    the drain of the second MOS transistor is connected to said second node of said latch circuit, and the source of said second MOS transistor is connected to said reference potential;
    when input of the input signal of said first voltage source is delayed with respect to feeding of said second voltage source, during the period corresponding to said delay time, the first node or second node of the latch circuit is fixed at the voltage of either the first logic level or the second logic level.

6. The level shift circuit described in claim 5 wherein a power-on-reset signal generated on the basis of the second voltage source when the power is turned ON is input to said latch circuit, and the latch responds to said power-on-reset signal to hold the first node or the second node at the voltage of either the first logic level or the second logic level.

* * * * *